(12) United States Patent
Abedifard

(10) Patent No.: US 7,145,816 B2
(45) Date of Patent: Dec. 5, 2006

(54) USING REDUNDANT MEMORY FOR EXTRA FEATURES

(75) Inventor: Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 10/918,894

(22) Filed: Aug. 16, 2004

(65) Prior Publication Data

US 2006/0034136 A1 Feb. 16, 2006

(51) Int. Cl.
*G11C 29/00* (2006.01)
(52) U.S. Cl. .................. 365/200; 365/189.07; 365/201
(58) Field of Classification Search ...................... None
See application file for complete search history.

(56) References Cited

U.S. PATENT DOCUMENTS

| | | | | |
|---|---|---|---|---|
| 4,450,559 A | * | 5/1984 | Bond et al. ..................... 714/6 |
| 4,527,251 A | * | 7/1985 | Nibby et al. .................... 714/8 |
| 5,491,664 A | * | 2/1996 | Phelan ........................ 365/200 |
| 5,881,003 A | * | 3/1999 | Kirihata et al. .............. 365/200 |
| 6,233,181 B1 | * | 5/2001 | Hidaka ........................ 365/200 |
| 6,446,177 B1 | | 9/2002 | Tanaka | |
| 6,650,578 B1 | * | 11/2003 | Kojima et al. ............... 365/200 |
| 6,757,842 B1 | * | 6/2004 | Harari et al. ................... 714/7 |
| 6,956,769 B1 | * | 10/2005 | Lee ........................ 365/185.09 |
| 2002/0036930 A1 | | 3/2002 | Shibata | |
| 2003/0167372 A1 | | 9/2003 | Lee | |

* cited by examiner

*Primary Examiner*—Son L. Mai
(74) *Attorney, Agent, or Firm*—Leffert Jay & Polglaze, P.A.

(57) ABSTRACT

Apparatus and methods are provided. A memory device has a memory array comprising primary and redundant portions. A redundancy circuit is coupled to the memory array and is coupled to receive a command signal. The redundancy circuit is adapted to be selectively programmed for selecting a redundant portion of the memory array for programming extra features in response to the command signal when the redundant memory portion is not used for replacing the primary portion.

36 Claims, 3 Drawing Sheets

USING REDUNDANT MEMORY FOR EXTRA FEATURES

TECHNICAL FIELD OF THE INVENTION

The present invention relates generally to memory devices and in particular the present invention relates to using redundant memory of memory devices for extra features.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modem personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating gate memory cells by selecting the word line connected to their control gates. The row of selected memory cells then place their data values on the column bit lines by flowing a differing current, depending upon their programmed states, from a connected source line to the connected column bit lines.

The array of memory cells for NAND flash memory devices is also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Many memory devices require extra space for programming extra features, such as space for one-time programmable (OTP) features or other features, such as a memory device identification, e.g., a cellular phone serial number and/or access code. The extra space often requires increased die size, which increases cost. Extra features are often added to a memory as extra memory blocks. If these memory blocks are added to a fixed location, there could be problems when that location is defective and cannot be replaced.

For the reasons stated above, and for other reasons stated below which will become apparent to those skilled in the art upon reading and understanding the present specification, there is a need in the art for alternatives for accommodating extra features on memory devices.

SUMMARY

The above-mentioned problems with accommodating extra features on memory devices and other problems are addressed by the present invention and will be understood by reading and studying the following specification.

For one embodiment, the invention provides a memory device with a memory array comprising primary and redundant portions, and a redundancy circuit coupled to the memory array and coupled to receive a command signal. The redundancy circuit is adapted to be selectively programmed for selecting a redundant portion of the memory array for programming extra features in response to the command signal when the redundant memory portion is not used for replacing the primary portion.

For another embodiment, the invention provides a method of operating a memory device, including programming extra features in a redundant portion of a memory array of the memory device when the redundant portion is not designated for replacing a primary portion of the memory array.

For another embodiment, the invention provides a method of configuring a memory device, including programming a redundancy circuit of the memory device to select at least one redundant portion of a memory array of the memory device for programming extra features when the redundancy circuit receives a command signal.

Further embodiments of the invention include methods and apparatus of varying scope.

DETAILED DESCRIPTION

Figure 1:
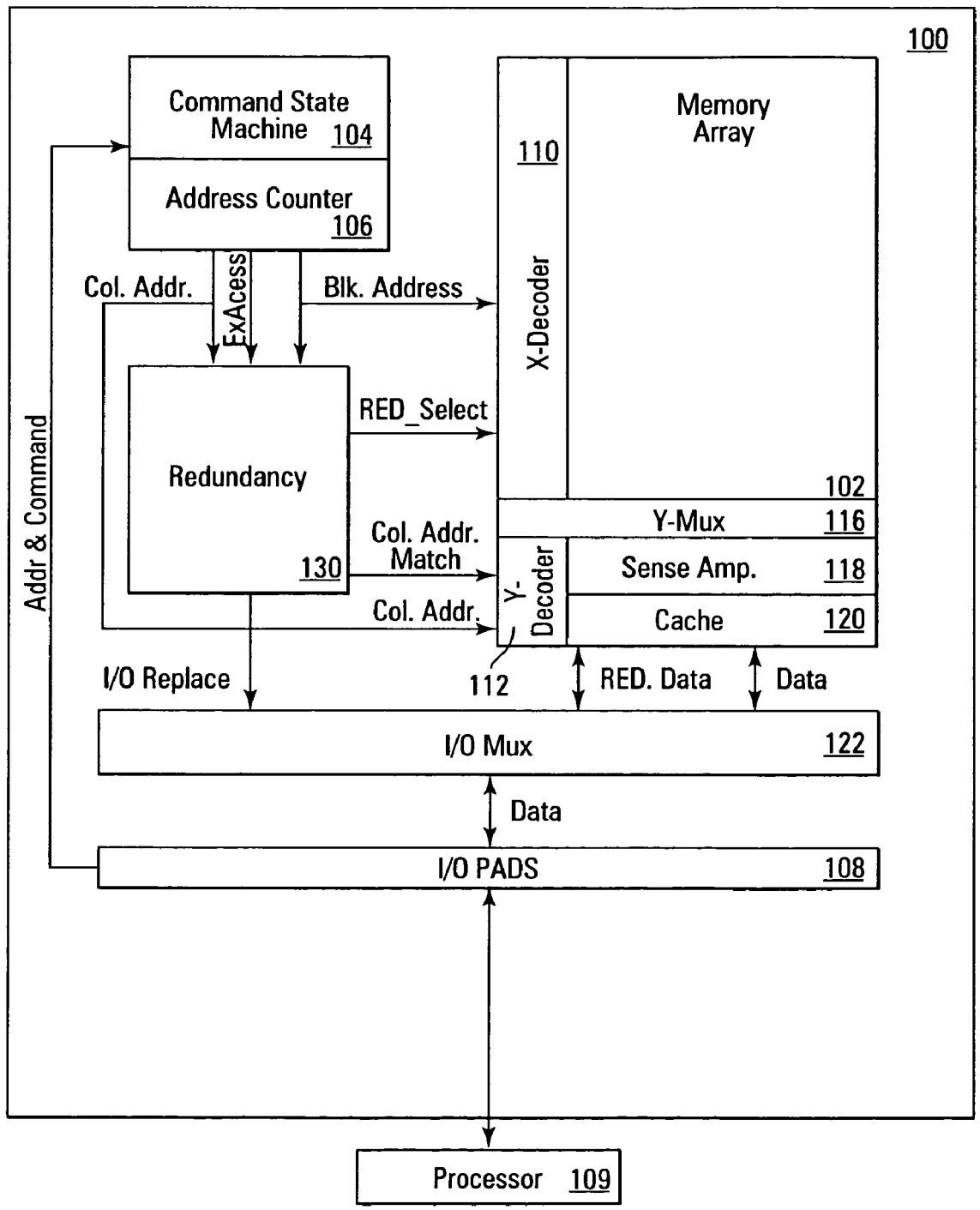
FIG. 1 is a simplified block diagram of a memory device, according to an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a simplified block diagram of a memory device 100, according to an embodiment of the present invention. For one embodiment, the memory device is a flash memory device, such as NAND or NOR flash. Memory device 100 includes a memory array 102, e.g., arranged in blocks of rows and columns of memory cells, such as floating-gate transistors. For one embodiment, each memory block spans a NAND string, e.g., 32 memory cells connected source to drain in series, and the select gates at either end of the NAND string in the column or (Y—) direction and a plurality of columns in the row (or X—) direction, e.g. about 2000. Memory array 102 includes a primary array that includes a plurality of primary blocks and primary columns and a redundant array that includes a plurality of redundant blocks and redundant columns. The redundant blocks and redundant columns are mapped into the primary array to replace defective primary blocks and columns in the primary array.

A state machine 104 is provided to control specific operations performed on the memory array and cells. State machine 104 controls read, write, erase and other memory operations. The memory device 100 further has an address counter 106 to increment an address of the memory array 102. The state machine 104 directs operations of the address counter 106.

Input/output pads 108 are provided to connect memory device 100 to an external processor 109, such as a part of an electronic system, e.g., a cellular telephone, computer, etc. A portion of input/output pads 108 is coupled to state machine 104. State machine 104 receives address and command signals from the processor via that portion of input/output pads 108.

An X-decoder (or row decoder) 110 and a Y-decoder (or column decoder) 112 are provided to decode address signals provided via I/O pads 108. Address signals are received and decoded to access the memory array 102. A Y-select multiplexer 116 is provided to select a column of the array identified with the Y-decoder 112. Sense amplifier and compare circuitry 118 is used to sense data stored in the memory cells and verify the accuracy of stored data.

A data cache 120 is included and operates in concert with command state machine 104 for buffering data reads and writes. During a read access, data cache 120 stores large data retrievals from memory array 102 to be selected for output by an input/output multiplexer 122 to the processor 109 via I/O pads 108. During a write access, cache 120 buffers incoming data from input/output multiplexer 122 to be written to memory array 102, allowing data to be sent to the memory device 100 as fast as the processor can transfer it through another portion of I/O pads 108.

A redundancy circuit 130 is coupled to command state machine 104 and address counter 106. In operation, column addresses are sent to Y-decoder 112 and to redundancy circuit 130, and block addresses are sent to X-decoder 110 and to redundancy circuit 130. Redundancy circuit 130 respectively compares the column addresses and block addresses to addresses of defective primary columns and blocks. When redundancy circuit 130 finds a match, it redirects the address from the defective block or column in the primary array of memory array 102 to the respective replacement redundant block or column. More specifically, redundancy circuit 130 sets a redundant register select signal RED_Select to a first state when a primary block address matches a defective primary block address for selecting a replacement redundant block for the defective primary block. Redundancy circuit 130 sends a Column Address Match command signal to Y-decoder 112 when a primary column address matches a defective primary column address that selects a replacement redundant column therefore.

Data from the primary and redundant arrays of memory array 102 are sent to input/output multiplexer 122. The data from the primary array includes data from good blocks and columns as well as defective blocks and/or columns. Redundancy circuit 130 sends a command signal I/O replace to input/output multiplexer 122, as shown in FIG. 1, that instructs input/output multiplexer 122 to replace the data of the defective blocks and/or columns with the data of the redundant blocks and/or columns that respectively replace the defective blocks and/or columns.

When redundancy circuit 130 receives an extra features access command signal ExAcess from command state machine 104, redundancy circuit 130 sets redundant register select signal RED_Select to the first state for selecting at least one of the redundant blocks for programming extra features, such as one-time programmable (OTP) features or other features. For example, the extra features may be used for memory device identification, e.g., a wireless telephone serial number and/or access code. When a redundant block is used for extra features, incoming addresses for that redundant block are ignored.

Using a redundant block for programming extra features eliminates the need for increasing the size of the memory device die, which increases costs. This is because a number of redundant elements are designed into a memory array to allow for replacement of defective elements. There are often more redundant elements than defective elements, resulting in extra redundant elements. Using these extra redundant elements for extra features eliminates the need to add fixed space to a memory device for extra features because the decision to use extra redundant elements for extra features can be made after testing the memory device.

Figure 2:
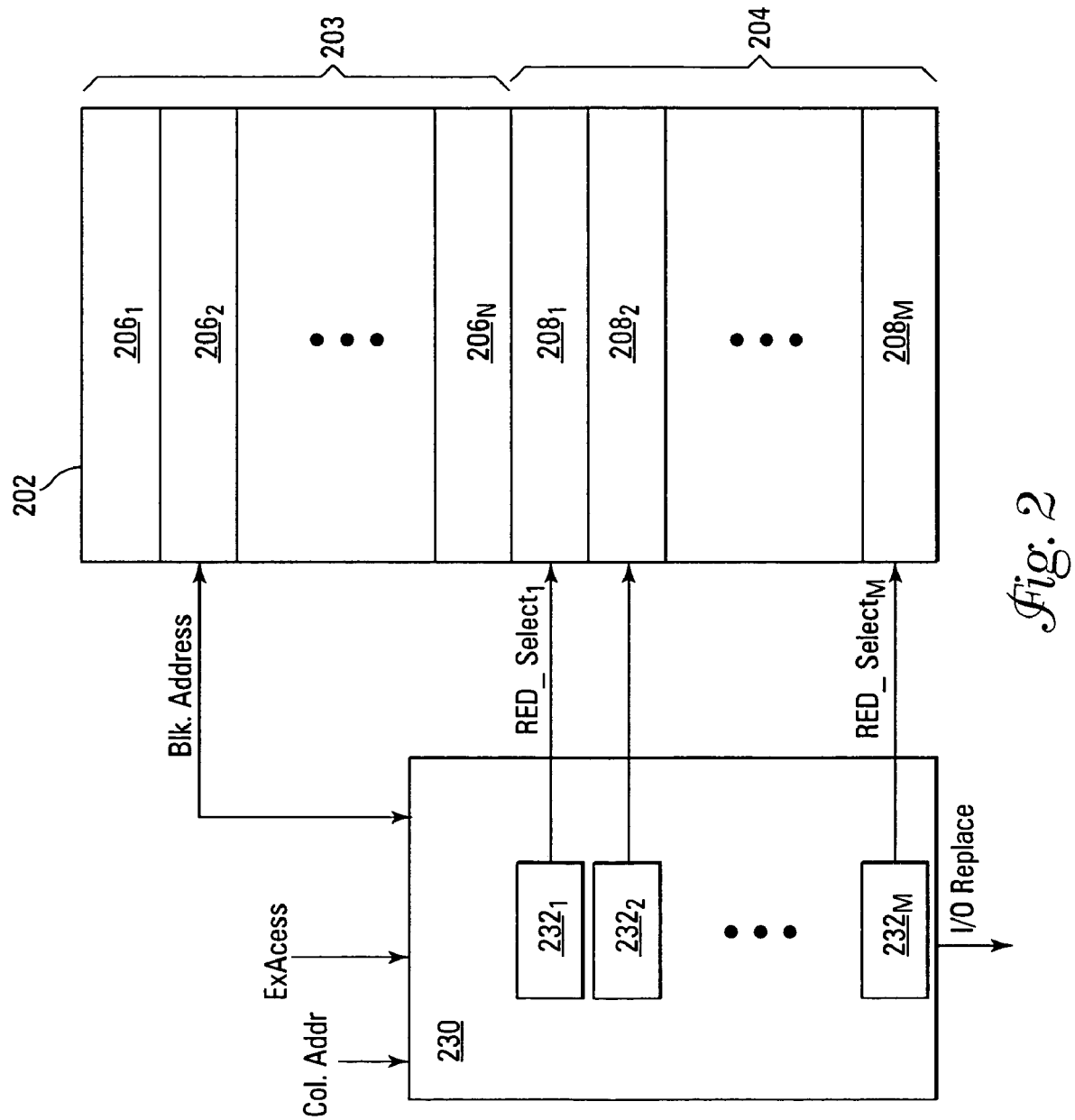
FIG. 2 illustrates a portion of a memory device, according to another embodiment of the invention.

FIG. 2 illustrates a portion of a memory device, such as memory device 100 of FIG. 1, according to another embodiment of the invention. Specifically, FIG. 2 shows a memory array 202 having a primary array 203 with primary memory blocks $206_1$ to $206_N$ and a redundant array 204 with redundant memory blocks $208_1$ to $208_M$. A redundancy circuit 230 is included. Redundancy circuit 230 includes comparators $232_1$ to $232_M$ that are respectively coupled to redundant memory blocks $208_1$ to $208_M$. Each comparator 232 is adapted to be set for selecting its corresponding redundant memory block 208 to replace a defective primary memory block 206 or for selecting its corresponding redundant memory block 208 for extra features.

Figure 3:
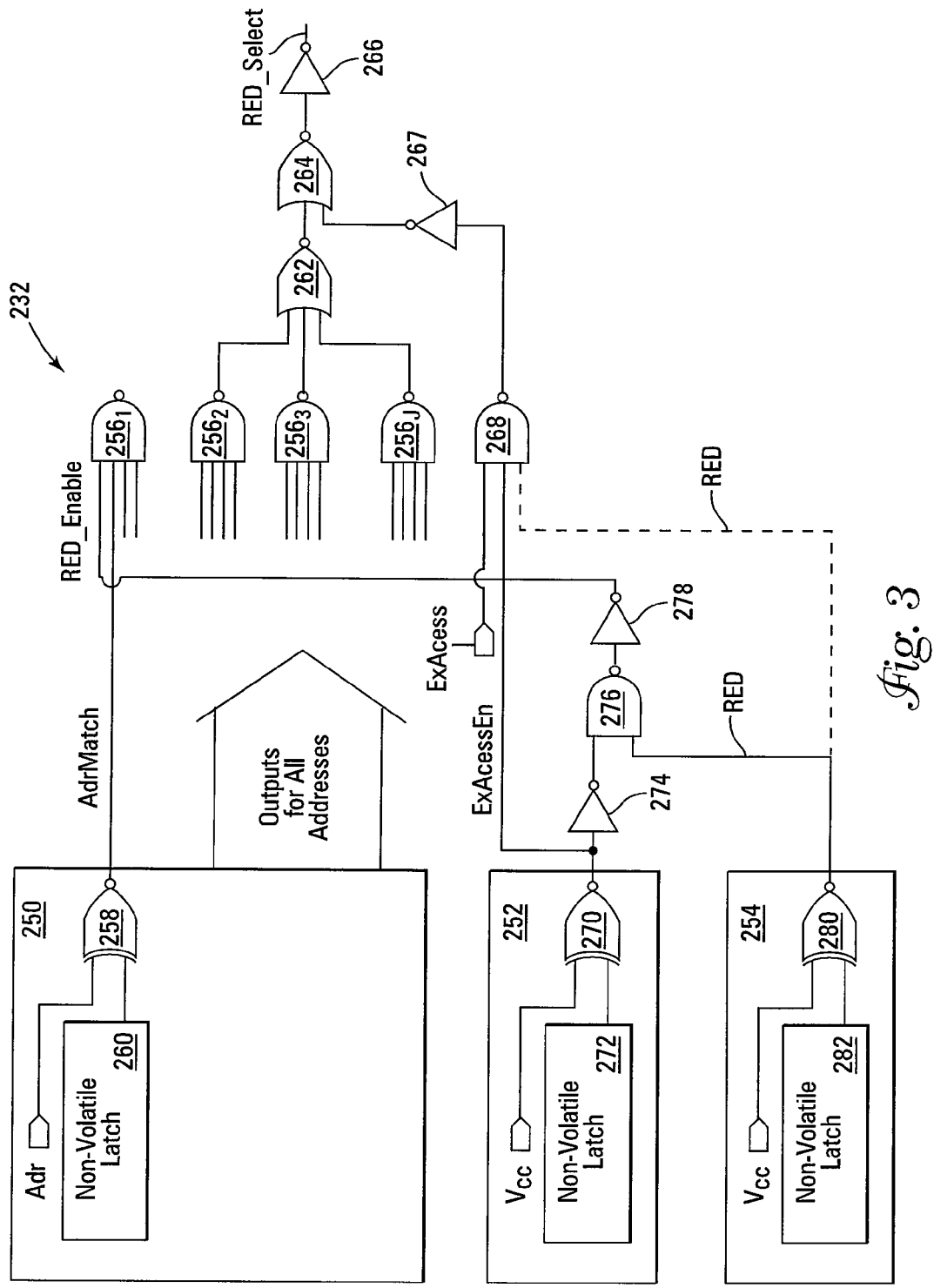
FIG. 3 is an exemplary logic diagram of a comparator of a memory device, according to another embodiment of the invention.

FIG. 3 is an exemplary logic diagram of a comparator 232, according to another embodiment of the invention. Comparator 232 includes an address comparator 250, an extra features selector 252, and a redundancy selector 254. A bank of NAND gates $256_1$ to $256_J$ is included. An input of one of the NAND gates 256, e.g., NAND gate $256_1$, receives a redundancy enable signal RED_Enable, while the remaining inputs are coupled to address comparator 250. Each of the remaining inputs receives an address match signal AdrMatch. Specifically, each remaining input is coupled one-to-one to an XNOR gate 258 of address comparator 250 that outputs AdrMatch, as shown in FIG. 3 for a single XNOR gate 258 coupled to an input of NAND gate $256_1$.

One input of each XNOR gate 258 receives an incoming address signal Adr, e.g., a bit of an incoming memory block address, while the other input receives a latched data signal from a non-volatile latch 260, e.g., a non-volatile flip flop, of address comparator 250. The latched data signal is indicative of a bit of an address of a known defective primary memory block 206. When the address signal Adr matches the latched data signal, the address match signal AdrMatch assumes a first logic level, such as logic 1, and when the address signal Adr differs from the latched data signal, the address match signal AdrMatch assumes a second logic level, such as logic 0. Note that there is a XNOR gate 258 and a non-volatile latch 260 for each bit of a memory block address to be compared.

When each address signal Adr matches a bit of an address of a known defective memory block, then the incoming memory block address matches the address of the known defective memory block, and the address match signal AdrMatch at each remaining input of the bank of NAND gates 256 is at the first logic level. When at least one address signal Adr does not match a bit of an address of a known defective memory block, then the incoming memory block address does not match the address of the known defective memory block, and the address match signal AdrMatch at least one of the remaining inputs of the bank of NAND gates 256 is at the second logic level.

The output of each NAND gate 256 is coupled to an input of a NOR gate 262 having an output coupled to a first input of a NOR gate 264. An output of NOR gate 264 is coupled to an input of an inverter 266. A second input of NOR gate 264 is coupled to an output of an inverter 267 having an input coupled to a NAND gate 268. A first input of NAND gate 268 receives the extra features access command signal ExAcess, while a second input is coupled to an output of an XNOR gate 270 of extra features selector 252.

One input of XNOR gate 270 is coupled to a non-volatile latch 272, such as a non-volatile flip flop, of extra features selector 252, while another input is coupled to a potential, such as Vcc, e.g., a logic high (or logic 1). When the output of non-volatile latch 272 and the potential each have the same logic levels, XNOR gate 270 outputs an extra features access enable signal ExAcessEn having a first logic level, such as logic 1, and when the logic level of the output of non-volatile latch 272 and logic level of the potential differs, the extra features access enable signal ExAcessEn assumes a second logic level, such as a logic low (or logic 0).

The output of XNOR gate 270 is also coupled to an input of an inverter 274 whose output is coupled to a first input of a NAND gate 276. An output of NAND gate 276 is coupled to an input of an inverter 278 whose output supplies the redundancy enable signal RED_Enable to the input of NAND gate $256_1$. A second input of NAND gate 276 is coupled to an output of an XNOR gate 280 of redundancy selector 254. For alternative embodiments, a third input of NAND gate 268 is also coupled to the output of XNOR gate 280.

One input of XNOR gate 280 is coupled to a non-volatile latch 282, such as a non-volatile flip flop, of redundancy selector 254, while another input is coupled to a potential, such as Vcc. When the output of non-volatile latch 282 and the potential each have the same logic levels, XNOR gate 280 outputs a redundancy signal RED having a first logic level, such as logic high (or logic 1), and when the logic level of the output of non-volatile latch 282 and logic level of the potential differs, the redundancy signal RED assumes a second logic level, such as a logic low (or logic 0).

During manufacturing, e.g., after testing, of the memory device, the memory device is configured for operation. During configuration of the memory device, comparator 232 can be programmed to operate in a redundancy operating mode or an extra features operating mode. In the redundancy operating mode, comparator 232 selects the associated redundant block 208 as a replacement memory block for a known defective primary memory block 206. In the extra features operating mode, comparator 232 selects its associated redundant block 208 for accessing extra features, such as one-time programmable (OTP) features, etc., when that redundant block 208 is not needed as a replacement block.

To select the redundancy operating mode, redundancy selector 254 is programmed so that the redundancy signal RED has a first logic level, such as a logic high (or logic 1), so that the second input to NAND gate 276 is at the first logic level. The extra features selector 252 is programmed so that the extra features access enable signal ExAcessEn has a second logic level, such as a logic low (or logic 0), so that the first input of NAND gate 276 after inverter 274 is at the first logic level. Therefore, the first and second inputs of NAND gate 276 are at the first logic level, and the redundancy enable signal RED_Enable at the input of NAND gate $256_1$ after the output of inverter 278 is at the first logic level.

When there is a match between an incoming block address and a known defective primary memory block 206, the address match signal AdrMatch at each of the remaining inputs of the block of NAND gates 256 is at the first logic level. Therefore, all of the inputs to the bank of NAND gates 256 are at the first logic level, meaning that all of the outputs of the bank NAND gates 256, and thus all of the inputs to NOR gate 262, are at the second logic level. Therefore, the output of NOR gate 262, and thus the first input of NOR gate 264, is at the first logic level.

During the redundancy operating mode, the extra features access command signal ExAcess and the extra features access enable signal ExAcessEn are at the second logic level at the first and second inputs of NAND gate 268. For embodiments where the output of redundancy selector 254 is not connected to NAND gate 268, this means that the output of NAND gate 268, and thus the second input of NOR gate 264 after inverter 267, is at the second logic level. Therefore, since the first input of NOR gate 264 is at the first logic level, the output of NOR gate 264 is forced to a logic low (or logic zero) since its inputs are at different logic values, and the redundant register select signal RED_Select after inverter 266 is at a logic high (or a logic 1). This selects the corresponding redundant memory block 208 so that it replaces (or is mapped to) the known defective primary memory block 206.

If the incoming memory block address does not match an address of a known defective primary memory block 206, at least one of the inputs of the banks of NAND gates 256 is at the second logic level, this forces at least one of the inputs to NOR gate 262 to a logic high because redundancy enable signal RED_Enable at the input of NAND gate $256_1$ is at the first logic level. Therefore, the output of NOR gate 262, and thus the first input to NOR gate 264, is a logic low. During the redundancy operating mode, with the extra features access command signal ExAcess and the extra features access enable signal ExAcessEn at the second logic level, e.g., a logic low, at the first and second inputs of NAND gate 266, the second input of NOR gate 264 after inverter 267 is a logic low. With both inputs of NOR gate 264 at logic lows, the redundant register select signal RED_Select after inverter 266 is at a logic low (or a logic 0). This means that the corresponding redundant memory block 208 is not selected to replace a primary memory block.

During the redundancy operating mode for alternative embodiments where a third input of NAND gate 268 is also coupled to the output of XNOR gate 280, the redundancy signal RED has the first logic level at the second input to NAND gate 276 and the third input of NAND gate 268, and the extra features access command signal ExAcess and the extra features access enable signal ExAcessEn are at the second logic level at the first and second inputs of NAND gate 268. Therefore, the output of NAND gate 268 is forced to a logic high (or logic 1), and the second input of NOR gate 264 after inverter 267 is a logic low (or a logic 0).

The first input of NOR gate 264 is at the first logic level, e.g., a logic high, when there is a match between an incoming block address and a known defective primary memory block 206, as described above. Therefore, for this situation, the first and second inputs of NOR gate 264 are different, so the redundant register select signal RED_Select after inverter 266 is at a logic high, selecting the redundant memory block 208 corresponding to the known defective primary memory block 206 to replace defective primary memory block 206.

The first input of NOR gate 264 is at a logic low when the incoming memory block address does not match an address a known defective primary memory block 206, as described above. Therefore, for this situation, the first and second inputs of NOR gate 264 are both logic lows, so the redundant register select signal RED_Select after inverter 266 is at a logic low, and redundant memory block 208 is not selected to replace the corresponding primary memory block 206.

To select the extra features operating mode for the embodiments where the output of redundancy selector 254 is not connected to NAND gate 268, the extra features selector 252 is programmed so that the extra features access enable signal ExAcessEn at the output of XNOR gate 270 is at the first logic level or a logic high. Thus, the second input of NAND gate 268 is a logic high. To use the redundant memory block 208 for programming extra features, the state machine sets the extra features access command signal ExAcess to the first logic level or logic high at the first input of NAND gate 268. Therefore, the first and second inputs of NAND gate 268 are logic highs, and the second input of NOR gate 264 after inverter 267 is a logic high. Note that when the second input of NOR gate 264 is a logic high, the redundant register select signal RED_Select at the output of inverter 266 is at a logic high regardless of the logic level of the first input of NOR gate 264. Therefore, the effect of redundancy selector 254, i.e., the redundancy signal RED, is overridden, and the redundancy operating mode is ignored.

Moreover, setting the extra features access enable signal ExAcessEn to a logic high overrides the redundancy signal RED and sets the logic level of the redundancy enable signal RED_Enable to a logic low regardless of the logic level of redundancy signal RED. For example, if redundancy signal RED is a logic high at the second input of NAND gate 276, the extra features access enable signal ExAcessEn being a logic high means that the first and second inputs to NAND gate 276 are respectively logic low and a logic high, the output of NAND gate 276 is logic high, and the redundancy enable signal RED_Enable at the output of inverter 278 is a logic low. If redundancy signal RED is a logic low at the second input of NAND gate 276, both the first and second inputs of NAND gate 276 are logic lows, the output of NAND gate 276 is a logic high, and the redundancy enable signal RED_Enable at the output of inverter 278 is a logic low.

When the redundancy enable signal RED_Enable is a logic low, the outputs of the bank of NAND gates 256 (inputs of NOR gate 262) are always logic highs, regardless of the logic levels at the other inputs of the bank of NAND gates 256. This means that the output of NOR gate 262 is a logic low, and the first input of NOR gate 264 is always a logic low. Therefore, when the extra features operating mode is selected by programming extra features access enable signal ExAcessEn to be a logic high and when the state machine sets the extra features access command signal ExAcess to a logic high to use the redundant memory block 208 for extra features, the first and second inputs of NOR gate 264 are respectively set at a logic low and a logic high, and the redundant register select signal RED_Select signal at the output of inverter 266 is a logic high for selecting the corresponding redundant register for extra features. The access enable signal ExAcessEn can be thought of as an extra bit that can be set to override the redundancy operating mode in favor of the extra features operating mode.

To select the extra features operating mode for alternative embodiments where a third input of NAND gate 268 is also coupled to the output of XNOR gate 280, the redundancy signal RED is set to a logic high, and the extra features access command signal ExAcess and the extra features access enable signal ExAcessEn are set to logic highs. This forces the second input of NOR gate 264 to a logic high. Adding the third input to NAND gate 268 and setting it to a logic high has no effect on the logic value at the first input of NOR gate 264. Therefore, as described above, setting the access enable signal ExAcessEn to a logic high forces the first input of NOR gate 264 to a logic low. Therefore, the first and second inputs of NOR gate 264 are respectively set at a logic low and a logic high, and the redundant register select signal RED_Select signal at the output of inverter 266 is a logic high for selecting the corresponding redundant register for extra features.

Note, however, that for alternative embodiments where a third input of NAND gate 268 is also coupled to the output of XNOR gate 280, the effect of the redundancy signal RED, and thus the redundancy selector 254, is not overridden for the extra features operating mode. This is because if the redundancy signal RED is at a logic low at the third input of NAND gate 268 with extra features access command signal ExAcess and the extra features access enable signal ExAcessEn set to logic highs, the second input of NOR gate 264 is a logic low so that both inputs of NOR gate 264 are logic lows. This means that the redundant register select signal RED_Select signal is a logic low, and the redundant register is not selected for extra features.

Note that changing the extra features access command signal ExAcess to a logic low, sets second input of NOR gate 264 to a logic low so that both inputs of NOR gate 264 are logic lows. Therefore, the redundant register select signal RED_Select signal is a logic low, and the redundant register is not selected for extra features. Therefore, changing the logic value of the access command signal ExAcess, selects or deselects the redundant register for extra features during the extra features operating mode. Note that this is true regardless of whether NAND gate 268 has an input for receiving the redundancy signal RED.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
a memory array comprising primary and redundant portions; and
a redundancy circuit coupled to the memory array and coupled to receive a command signal, the redundancy circuit adapted to be selectively programmed for selecting a redundant portion of the memory array for programming extra features in response to the command signal when the redundant memory portion is not used for replacing a primary portion;
wherein the redundancy circuit is further adapted to be selectively programmed to select the redundant portion of the memory array for replacing the primary portion when the primary portion has a defect.

2. The memory device of claim 1, wherein the primary and redundant portions are respectively primary and redundant memory blocks.

3. The memory device of claim 1, wherein the primary and redundant portions each include NAND strings of floating-gate memory cells.

4. The memory device of claim 1, wherein the extra features comprise one-time programmable features.

5. A method of operating a memory device, comprising:
using a redundancy circuit to select a redundant portion of a memory array of the memory device that is not designated for replacing a primary portion of the memory array; and
programming extra features in the selected redundant portion of the memory array;
wherein when in a redundancy operating mode the redundancy circuit selects the redundant portion to replace a defective primary portion of the memory array.

6. The method of claim 5 further comprises overriding enabling the redundancy operating mode.

7. The method of claim 5, wherein the extra features comprise one-time programmable features.

8. The method of claim 5, wherein the redundant and primary portions are respectively redundant and primary memory blocks.

9. The method of claim 8, wherein the redundant and primary memory blocks comprise rows and columns of memory cells.

10. The method of claim 9, wherein each column comprises a NAND string of the memory cells.

11. A NAND flash memory device comprising:
a memory array comprising a plurality of primary portions and a plurality of redundant portions; and
a redundancy circuit coupled to the memory array and coupled to receive a command signal, the redundancy circuit adapted to be selectively programmed for selecting at least one redundant portion of the memory array for programming extra features in response to the command signal when the at least one redundant memory portion is not used for replacing a primary portion;
wherein the redundancy circuit is further adapted to be selectively programmed to select one or more redundant portions of the memory array for replacing one or more primary portions when those primary portions have a defect.

12. The memory device of claim 11, wherein each of the primary portions is a primary memory block and each of the redundant portions is a redundant memory block.

13. The memory device of claim 12, wherein each primary memory block and each redundant memory block comprises NAND strings of floating-gate transistors.

14. The memory device of claim 11, wherein the extra features comprise one-time programmable features.

15. A memory device comprising:
a memory array comprising a plurality of primary memory blocks and a plurality of redundant memory blocks;
a command state machine for controlling operations on the memory array; and
a redundancy circuit coupled to the memory array and to the command state machine, the redundancy circuit comprising a plurality of comparators respectively corresponding to the redundant memory blocks, wherein each of the comparators is adapted to be selectively programmed for selecting its corresponding redundant memory block for programming extra features in response to a command signal from the command state machine when that redundant memory block is not used for replacing a primary memory block.

16. The memory device of claim 15, wherein each of the comparators is further adapted to be selectively programmed for selecting its corresponding redundant memory block to replace an addressed primary memory block when that primary memory block has a defect.

17. An electronic system comprising:
a processor; and
a memory device coupled to the processor, the memory device comprising:
a memory array comprising primary and redundant portions; and
a redundancy circuit coupled to the memory array and coupled to receive a command signal, the redundancy circuit adapted to be selectively programmed for selecting a redundant portion of the memory array for programming extra features in response to the command signal when the redundant memory portion is not used for replacing the primary portion;
wherein the redundancy circuit is further adapted to be selectively programmed to select the redundant portion of the memory array for replacing the primary portion when the primary portion has a defect.

18. The electronic system of claim 17, wherein the extra features comprise one-time programmable features.

19. The electronic system of claim 18, wherein the one-time programmable features comprise a memory device identification or a cellular telephone serial number and/or access code.

20. An electronic system comprising:
a processor; and
a memory device coupled to the processor, the memory device comprising:

a memory array comprising a plurality of primary memory blocks and a plurality of redundant memory blocks;
a command state machine for controlling operations on the memory array; and
a redundancy circuit coupled to the memory array and to the command state machine, the redundancy circuit comprising a plurality of comparators respectively corresponding to the redundant memory blocks, wherein each of the comparators is adapted to be selectively programmed for selecting its corresponding redundant memory block for programming extra features in response to a command signal from the command state machine when that redundant memory block is not used for replacing a primary memory block.

21. The electronic system of claim 20, wherein the extra features comprise one-time programmable features.

22. A method of operating a memory device, comprising:
using a redundancy circuit to select a first redundant portion of a memory array of the memory device that is not designated for replacing a primary portion of the memory array, wherein when in a redundancy operating mode the redundancy circuit selects the first redundant portion to replace a defective primary portion of the memory array;
programming extra features in the selected first redundant portion of the memory array; and
replacing a primary portion of the memory array with a second redundant portion of the memory array when that primary portion has a defect.

23. The method of claim 22, wherein the extra features comprise one-time programmable features.

24. The method of claim 22, wherein the first and second redundant portions are redundant memory blocks and the primary portion is a primary memory block.

25. The method of claim 24, wherein the redundant and primary memory blocks comprise NAND strings of memory cells.

26. The method of claim 22 further comprises overriding enabling the redundancy operating mode.

27. A method of operating a memory device, comprising:
receiving a command signal at a redundancy circuit of the memory device from a command state machine of the memory device;
in response to receiving the command signal, using the redundancy circuit to select a redundant memory block of a memory array of the memory device that is not designated for replacing a defective primary memory block of the memory array; and
programming the selected redundant memory block with extra features;
wherein when in a redundancy operating mode the redundancy circuit selects the redundant memory block to replace a defective primary memory block of the memory array.

28. The method of claim 27 further comprises overriding enabling the redundancy operating mode.

29. The method of claim 27, wherein the extra features comprise one-time programmable features.

30. The method of claim 29, wherein the one-time programmable features comprise a memory device identification or a cellular telephone serial number and/or access code.

31. The method of claim 27, wherein the redundant and primary memory blocks comprise NAND strings of floating-gate memory cells.

32. The method of claim 27 further comprises:
receiving addresses of primary memory blocks at the redundancy circuit;
comparing the addresses of primary memory blocks to addresses of known defective primary memory blocks using the redundancy circuit; and
when an address of a primary memory block matches an address of a known defective primary memory block, selecting a redundant memory block designated for replacing a defective primary memory block to replace the primary memory block whose address matches the address of the known defective primary memory block using the redundancy circuit.

33. A method of operating a memory device, comprising:
receiving a first signal having a logic high level at a first input of a NAND gate of a comparator of a redundancy circuit of the memory device from a command state machine of the memory device, wherein the comparator corresponds to a redundant memory block of a memory array of the memory device that is not designated for replacing a defective primary memory block of the memory array;
receiving a second signal having a logic high level from an extra features selector of the comparator at a second input of the NAND gate;
receiving an inverted output from the NAND gate at a first input of a NOR gate of the comparator that has a logic high level in response to the receiving the first and second signals at the first and second inputs of the NAND gate, wherein the logic high level at the first input of the NOR gate causes the NOR gate to output a third signal having a logic low level irrespective of the logic level at a second input of the NOR gate, wherein inverting the logic level of the third signal to a logic high level causes the comparator to select its corresponding redundant memory block for programming extra features.

34. The method of claim 33 further comprises receiving a fourth signal having a logic high level from a redundancy selector of the comparator at a third input of the NAND gate.

35. A method of configuring a memory device, comprising:
testing a memory array of the memory device to determine known defective portions of the array;
configuring one or more redundancy circuits to select an associated redundant portion of the memory array when access to a known defective portion of the array is requested;
determining that at least one redundancy circuit is not configured to replace a known defective portion with an associated redundant portion; and
configuring the at least one redundancy circuit to select its associated redundant portion in response to a control signal indicative of a desire to access a fixed location of the memory device not associated with a memory location address.

36. The method of claim 35, wherein the at least one redundancy circuit is configured to select its associated redundant portion for extra features.

* * * * *